(12) United States Patent
Sela et al.

(10) Patent No.: US 7,282,921 B2
(45) Date of Patent: Oct. 16, 2007

(54) SYSTEM, APPARATUS AND METHOD FOR DETECTION OF ELECTRICAL FAULTS

(75) Inventors: Isaac Sela, Petach-Tikva (IL); Eliyahu-yosef Bender, Ramat Beat Shemesh (IL)

(73) Assignee: Isra-Juk Electronics Ltd., Petach-Tikva (IL)

( * ) Notice: Subject to any disclaimer, the term of this patent is extended or adjusted under 35 U.S.C. 154(b) by 0 days.

(21) Appl. No.: 11/327,446

(22) Filed: Jan. 9, 2006

(65) Prior Publication Data

US 2006/0119368 A1 Jun. 8, 2006

Related U.S. Application Data

(63) Continuation-in-part of application No. PCT/IL04/00612, filed on Jul. 8, 2004.

(51) Int. Cl.
*G01R 31/08* (2006.01)
*G01R 31/00* (2006.01)

(52) U.S. Cl. .................. 324/522; 324/508; 324/503

(58) Field of Classification Search ........... 324/508, 324/522, 537, 527, 523, 771; 702/71, 181
See application file for complete search history.

(56) References Cited

U.S. PATENT DOCUMENTS

| 3,176,219 A | * | 3/1965 | Behr .................... 324/508 |
| 4,370,609 A | * | 1/1983 | Wilson et al. ........... 324/522 |
| 4,672,555 A | | 6/1987 | Hart et al. .............. 700/276 |
| 4,740,756 A | * | 4/1988 | Graham et al. .......... 324/551 |
| 4,855,861 A | * | 8/1989 | Bergman et al. ......... 361/65 |
| 4,858,141 A | | 8/1989 | Hart et al. .............. 702/61 |
| 4,884,022 A | | 11/1989 | Bishop ................. 324/157 |
| 5,196,982 A | | 3/1993 | Landsberg et al. ...... 361/93.1 |
| 5,272,440 A | * | 12/1993 | Weynachter et al. ..... 324/522 |
| 5,272,585 A | | 12/1993 | Gibbs |
| 5,315,236 A | | 5/1994 | Lee ..................... 324/157 |
| 5,452,173 A | | 9/1995 | Brannon |
| 5,485,093 A | * | 1/1996 | Russell et al. ........... 324/522 |
| 5,625,751 A | * | 4/1997 | Brandwajn et al. ........ 706/20 |
| 5,729,145 A | * | 3/1998 | Blades .................. 324/536 |
| 5,789,928 A | * | 8/1998 | Baker .................. 324/623 |
| 5,869,960 A | | 2/1999 | Brand .................. 324/142 |
| 5,890,097 A | * | 3/1999 | Cox ..................... 702/67 |
| 6,397,157 B1 | * | 5/2002 | Hogle et al. ............ 702/65 |
| 6,421,618 B1 | * | 7/2002 | Kliman et al. ........... 702/58 |
| 6,445,188 B1 | * | 9/2002 | Lutz et al. ............. 324/508 |
| 6,777,954 B2 | * | 8/2004 | Yamada et al. .......... 324/543 |
| 6,892,163 B1 | * | 5/2005 | Herzog et al. ........... 702/181 |
| 2005/0060116 A1 | * | 3/2005 | Yeung ................. 702/120 |

* cited by examiner

*Primary Examiner*—Anjan Deb
(74) *Attorney, Agent, or Firm*—Martin Fleit; Paul D. Bianco; Fleit Kain Gibbons Gutman Bongini & Bianco P.L.

(57) ABSTRACT

System for monitoring an electrical system of a facility includes one or more local sensing devices, each of which is adapted to be connected to the electrical system of the facility in proximity to a respective load that receives power from the electrical system so as to make local measurements of a voltage across the load continuity measurements of electrical-power presence at one or more points in the electrical system of said facility. A processing unit is adapted to receive and compare the local measurements to reference measurements of the voltage supplied to the facility, in order to detect a fault in the electrical system.

14 Claims, 8 Drawing Sheets

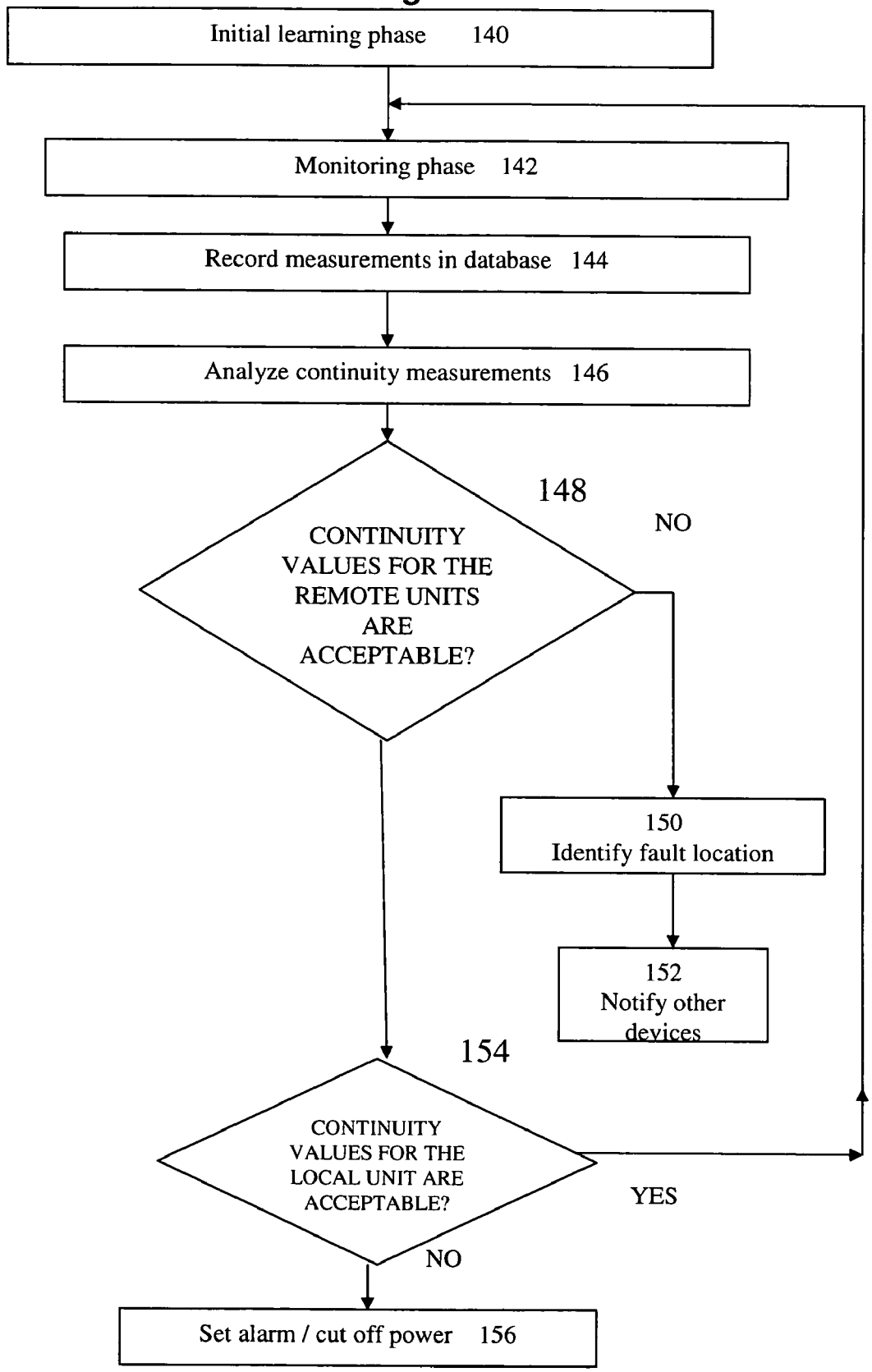

SYSTEM, APPARATUS AND METHOD FOR DETECTION OF ELECTRICAL FAULTS

The application is a continuation in part, claiming priority from PCT application no. PCT/IL04/000612 filed on Jul. 8, 2004 having a priority date of Jul. 9, 2003. The present invention relates to the field of electrical safety. More particularly, the invention relates to systems and methods providing an early, manual or automatic detection of electrical faults in wiring systems and connected appliances.

BACKGROUND OF THE INVENTION

Nearly all facilities that use electricity are equipped with a system containing fuses and/or circuit breakers, thus applied to cut off electrical supply when an electrical fault occurs. These devices operate by sensing excess current or other current-related phenomena, which typically occurs due to a short circuit, connection/disconnection of loads, short-term wiring disconnections or other electrical faults. (For example, arc-fault circuit interrupters detect current changes that are typical of arc-faults, while ground-fault circuit interrupters compare incoming current to outgoing current.) Despite the fact that modern buildings and other facilities are equipped with modern electrical-fire prevention devices, improper power supply to loads in a facility are common and remain a severe hazard. According to the U.S. Fire Administration, for example, home electrical problems have recently accounted for 90,000 fires each year, causing over 700 deaths and $700 million in property losses. Such fires result from faulty wiring, from faults in appliances connected to the wiring, faults in the connections between the wiring itself or from any other part of the electrical system that conducts electrical current to the electrical loads. The electrical disturbance can be intermittent or fixed, thus leading to a time-to-time disturbance in the required operation of the electrical loads or preventing them from working at all.

Many electrical fires are a direct result of an electrical fault, in which the temperature of an electrical conductor significantly increases. The power dissipated by a piece of an electrical conductor is proportional to the voltage across the piece of conductor and the current through the conductor.

It is known in the art to measure the voltage and current consumed by a particular electrical appliance; such measurements indicate the total power consumed by a user and enable to bill him accordingly. Numerous attempts for an early detection of electrical faults have been made in recent years. Examples of existing electrical-fire prevention devices are the fuse, the circuit breaker and the Arc-Fault Circuit Interrupter. The fuse is a piece of wire designed to melt when the current through it exceeds a pre-defined level and as a result de-energize the circuit connected to it. The circuit breaker also checks whether the current passing through it for not exceeding a pre-defined level. The Arc-Fault Circuit Interrupter checks the current passing through it in order to find current and/or voltage changes which are indicative of an arc-fault, in addition to checking whether the current passing through it for not exceeding a pre-defined level. However, these devices are designed to treat all the resistance or impedance of the circuit as one equivalent resistor, and therefore have no indication of the amount of energy dissipation over each of the conductors, resistors, capacitors, coils, and other parts comprising the circuit. In addition, aging of the wiring within a facility creates "parasitic" resistors, which consume additional power. Existing protection devices lack the ability to measure power ratio between a desired load and a parasitic one. In some cases, the parasitic resistance acts as a current-limiter and prevents the current in the faulty circuit from being out of range of a pre-defined tripping level of the fuses or circuit-breakers that are in use in that circuit. These cases are typical to electrical circuits in which the intended load has a small resistance (e.g. a mechanically-stuck motor that exhibits very low DC resistance). Such cases can also be found in faulty wiring problems that create a short-circuit, whereas the series-connection with the parasitic resistance limits the current through the shortened circuit to be below the tripping level of the fuse or the circuit-breakers being used.

In other cases, the temperature increase over the parasitic resistance is itself a cause for a fire. These cases are typical to electrical circuits in which the intended load is a "pure resistance" load—like a baking oven. The increasing ratio of the parasitic resistance as part of the overall circuit resistance causes an increased percentage of the total circuit power to be dissipated by the parasitic resistance. This leads to a significant increase in the temperature of the parasitic loads of the electrical system and may ignite a fire.

In some devices, the checking process is performed by a bi-metal conductor that bends and cuts the electrical current when the current through it exceeds a predefined limit. In other devices—the checking process is performed by an electromagnet that develops a magnetic power, whereas the magnetic power is proportional to the current passing through it. The existence of magnetic power affects the mechanical connection within the device and as a result the electrical current to the load is stopped. The protective device is implemented within the electrical circuit in such a manner that it is serially connected to appropriate load. As a result, current passing through the protection device causes dissipation of energy across the protection device itself. This may lead to heating of that protection device and additional undesired phenomena such as corrosion, carbonization of conductors and mechanical deformation of the different parts comprising the protective device itself. Hence, the protection device's capability to detect an electrical-current fault is severely affected.

Furthermore, different checks are applied for detecting an electrical fault in a facility, whereas these checks can be due to regulations, a suspect of an electrical fault, due to indications of a fault whose location is not determined, for preventive-maintenance activities or similar circumstances. Among these tests are the infra-red photography of wiring, switch-panels and other appliances. Another test is the ultrasonic detection of wiring/appliances problems. However, these checks require special equipment, which does not operate constantly as part of the inspected facility. Therefore, these appliances can only detect a problem that occurs when such a specific test equipment is set to perform the tests.

Additional attempts include devices, which are provided for detecting an electrical fault by measuring current. Such devices include the AFCI (Arc-Fault Circuit Interrupter), which checks for indications of electrical-arcing in the wire, the ELCI (Equipment Leakage Circuit Interrupter), the GFCI (Ground-Fault Circuit Interrupter), which monitors the electricity flowing in a circuit and if the amount flowing into the circuit differs from the amount returning this interrupter shut off the current, the LCDI (Leakage Current Detection and Interruption), which is built as part of a power-plug, the ALCI (Appliance Leakage Circuit Interrupter), which is implemented as an integrated part within the appliance, and the IDCI (Immersion Detection Circuit Interrupter), which detects immersion of an electrical appliance (like a hair-dryer) in water.

Prior art devices include U.S. Pat. No. 6,445,188, whose disclosure is incorporated herein by reference, describes an intelligent, self-monitoring AC power plug, which contains current and voltage sensors. The plug includes a miniature printed circuit board, with a filtered power supply, microcontroller, and external interface. Based on the combined readings from the voltage sensor and the current sensor, an embedded program running on the microcontroller can determine the power being consumed by the loading device. The plug may be connected to a special interface connector in order for data to be exchanged with a computer. The interface also allows for networking of several plug devices to a central reader.

As another example, U.S. Pat. No. 5,315,236 describes a power meter that plugs into an electric socket and has a socket for receiving the plug of an electric appliance. Alternatively, the power meter may be part of an electric wall switch or wall socket. U.S. Pat. No. 5,869,960 describes a similar sort of device. Other references relating to voltage testing and power monitoring include U.S. Pat. Nos. 4,672, 555, 4,858,141, 4,884,022 and 5,196,982. The disclosures of all of these patents are incorporated herein by reference.

One of the fundamental drawbacks common to all above-mentioned prior art devices is the fact that they all operate post factum. In other words, they only detect the faulty condition after it has already happened. In many cases this is usually too late to prevent the risk of fire from materializing.

The present invention takes a pre-factual approach to preventing the said risks. The invention detects the preconditions indicating a situation that might lead to unreasonable voltage-drop in the circuit, glowing and finally sparkling. Monitoring is done while the electrical distribution system is in regular use, with problematic voltage drops being the only fault-indication existing In addition, the present invention is capable of detecting for how long a circuit-breaker, AFCI or an equivalent device—did not trip. Long periods of time of usage without any tripping of these devices might be indicative of carbonization and micro-welding of contacts in the protection devices themselves.

A further drawback of prior art device is that they are all current-oriented devices. The problem with protection systems based on measuring current is that parasitic resistance in the electrical circuit acts as a current limiter which prevents the protection devices from tripping—even when the original load becomes a short circuit. This is because the protection devices measure a current common to the parasitic and the original loads as they are serially connected.

The current-oriented protection circuits hypothesis is of a faulty circuit to exhibit a "short-circuit" protection, with no parasitic load in it. The terminology used—of detecting short-circuits only—emphasizes the limited capabilities of such systems.

The fact that the existing protection systems are rated in terms of current, not voltage-drop percentage or absolute voltages—indicates that these protection devices measure current only.

Yet another aspect differentiating current measurements from voltage measurements: by measuring currents—faulty conditions may be detected only when currents EXCEED a predefined limit, whereas measuring voltages may detect faulty conditions that cause the measured voltage to be too low rather than too high.

It should be noted in particular that none of the existing methodologies propose a system for an early detection of electrical fault in an electrical system by monitoring voltage levels in parallel to loads within a facility.

It is thus the object of this invention to propose a system, apparatus and method that provides an early and automatic detection of electrical faults in a facility by monitoring local voltage levels (in parallel to the loads) and continuity measurements of electrical-power presence at one or more points along the electrical circuit of the electrical system of said facility.

It is yet another object of the present invention to further determine the type and specific location of the electrical fault which is most likely within the facility.

SUMMARY OF THE INVENTION

The present invention provides a system and method for monitoring local voltage levels and continuity measurements of electrical-power presence at one or more points in the electrical system of a facility, such as a home, business, vehicle, aircraft or ship. (In the context of the present patent application and in the claims, the electrical system is to be understood as comprising fixed wiring, such as wiring within the walls, ceiling and floors of the facility, fixed electrical-current conducting equipment and detachable wiring and circuits of electrical equipment that is powered by the system.) By measuring and tracking changes in the local voltage and continuity measurements regarding the presence of electrical-power, the system is able to detect changes and events that may be indicative of faults in the wiring, in the electrical current-conducting equipment or in electrical equipment that is powered by the electrical system. In many cases, these voltage changes or discontinuities of electrical-power presence give a more reliable indication and earlier warning of such faults than is provided by systems known in the art.

According to the preferred embodiment of the present invention, the sensing devices are functioned to sense voltage levels and measure the continuity of electrical-power presence by counting the number of alternating-current (AC) cycles passed since electrical-power was continually applied to the device. The sensing devices are deployed at different locations along the electrical circuit in the facility.

The sensing devices are typically constructed like a plug adapter, which is plugged in between the power plugs of different pieces of electrical equipment and the sockets that feed these power plugs. Alternatively or additionally, the local voltage level and/or continuity measurements devices may be contained within wall sockets or switches, or within the power plugs or in other parts of the powered equipment.

The local sensing devices typically communicate their local voltage readings and continuity measurements to a central control and monitoring station.

Alternatively, one or more controllers may be collocated with respective sensing devices or otherwise distributed within the facility. Preferably, the local sensing devices and central station communicate by modulation of signals over the electrical wiring of the facility, so that no other communication network is required. Alternatively, other means of communication may be used, such as dedicated control lines, data-communication network or wireless communication links such as radio frequency (RF), infra-Red (IR) or acoustic links, as are known in the art.

The said communication may include more than one communication means at a time. For example, using RF together with powerline messaging. This will achieve higher robustness of communication together with range expansion. Furthermore, communication may use two different methods on the same media at the same time such as digital-modem and analog-modulation over the powerline.

The central station (or distributed processors) monitors the readings it receives, which are indicative of the voltage across the local loads to which the local sensing devices are connected. Typically, the voltage readings are compared to a non-loaded reference voltage value, which is measured by the central station or by another local sensing device near the point at which electrical mains power enters the facility. Alternatively, the reference voltage value may be provided from an external source, for example, by the utility company that supplies the electricity. In addition, the processing unit can analyze previous voltage levels sensed by the local sensing device, determine the expected voltage values and thus have a reference value computed with or without reference value from any other device. According to another aspect of the invention, the reference voltage will be measured at the mains entering point to the facility—such as a panel-box of a house, an office or a factory.

The reference value may be just the voltage level—in case of a direct-current (DC) electrical-power, or a phasor, a combination of amplitude and phase indications—in case of alternating-current (AC) electrical-power system. In an AC electric-power system the reference value may be time-dependent, since the voltage sensed by the sensing devices itself is time-dependent. By comparing the voltage & continuity readings to the reference value and/or the other values measured and computed—the processing-units are able to detect the presence of faults, to distinguish actual voltage faults from fluctuations in the mains voltage and load variations that may occur in normal operation of certain appliances and, preferably, to identify the location of faults as they develop or occur in the electrical network. Alternatively or additionally, some fault conditions may be detected even without reference voltage information. This will be usually when the measured/computed values exceed the tolerable maximal or minimal values.

The processing units are further provided to store data and sensed values and perform calculations over time. These calculations include integration, averaging, standard deviation, Root-Mean-Square (RMS) calculations, comparisons to momentary and/or long-term expected voltage levels, computations performed on the results of the comparisons and/or any other statistical calculations and data-processing required to identify electrical fault. Such statistic calculation may include calculating the total harmonic distortion (THD) which accounts to the amount of the deviation of the measured signal from a pure sine wave in the electrical circuit.

In addition, the processing unit can analyze the time or AC-cycles passed since electrical-power was continually applied to the sensing devices. The processing unit compares this electrical-power continuity information with such information from other sensing devices, or from data stored in a non-volatile memory. In addition, the processing unit can include a local power source, such as a battery or capacitor for detecting external electrical-power discontinuities without being dependent on the external-power to perform this processing. The processing unit may display measured/computed values presented in a way that enable human checking of the facility or parts of it. These values may be displayed in the form of digits, waveforms, light-emitting diodes, bars of lighting segments and similar methods used for human reading of electrical parameters. Additionally or alternatively the processing unit may communicate these measured/computed values to other electrical equipment.

In addition, the implementation of an apparatus that displays the values measured and/or computed and allows a person to analyze them is also applicable. Such an apparatus can be configured without any communication media at all and can therefore be very cheap and easy to implement and install. Such an apparatus—with or without communication means may be used to measure the percentage of the mains voltage-drop—from the mains-supply to the location where it is measured—during normal use. It should be stressed out that such systems currently available in the market enable measurement of such voltage drop only with a controlled load connected to the mains. The present invention is capable of measuring the voltage drop on the power grid during the normal mode of operation. In addition, the present invention may be used instead of infra-red detection of glowing-connections in the mains wiring. Infra-Red thermal-check equipment is expensive, can only detect problems in places that can be photographed and on top of this it requires the problem to happen when the Infra-Red equipment photographs the suspected area. Consequently, if a problem develops in a place where photography is not possible, or when the mains wiring is cannot be thermally photographed—then the faulty condition will not be detected by Infra-Red thermal-check. The present invention will use equipment that can be installed as part of the wiring system for long periods of time—even as an integral part of the wiring system, and automatically detect glowing-connected conditions by analyzing the voltage drops over the powerline grid.

The invention may display waveforms of the reference signal that tracks the predicted mains powerline vs. the measured signal. Such a display will enable a person to see whether the measured signal describes an acceptable behavior. It should be stressed out that while such a signal testing is known in the telecommunication industry, it is a novel concept to the electricity industry.

There is therefore provided, in accordance with an embodiment of the present invention, a system for detecting faults in an electrical system of a facility having a main power supply, said system comprised of: at least one sensing device for measuring voltage levels and/or continuity measurements in proximity to a point of potential load, said potential load receiving power from said electrical system; and at least one processing unit (or display unit—for manual control) for analyzing said voltage and continuity measurements to detect abnormal measurements on the basis of known range of values and historical measurements.

In a disclosed embodiment, the local sensing devices are adapted to be coupled to an electrical socket from which the respective load receives the power. Typically, at least one of the local sensing devices includes a plug adapter, including receptacles, which are configured to receive a power plug of the respective load, prongs, which are electrically connected to the receptacles and are configured for insertion into the electrical socket, and a voltage sensor, coupled to measure the voltage between the receptacles and the prongs as well as the time (or AC cycles) elapsed since electrical-power was continually applied to each of the sensing device.

In an aspect of the invention each of the local sensing devices includes a communication interface, for communicating with other parts of the system. Preferably, the communication interface is adapted to convey messages between a local sensing devices and any other processing or sensing device, whereas this communication is carried out by modulation of signals over power lines of the electrical system.

In an embodiment of the invention, each (or at least some) of the local sensing devices may include a circuit breaker, which is controllable to cut off the power to the respective load when the processor detects the fault. Alternatively, a relay that will generate a ground-fault may be used. This can be useful in facilities that have a ground-fault circuit-interrupter being part of them. An intentionally-generated such a ground-fault will cause the ground-fault circuit-interrupter to trip—and de-energize a larger part of the facility or even the whole facility. Such mechanism of electrical power disconnection in case of a fault-detection may be cheaper to implement and may provide better electrical-fire protection than disconnection of the faulty-load itself.

In some embodiments, the system includes a reference sensing device, which is adapted to make the reference measurements of the voltage supplied to the facility. Typically, the reference sensing device is connected to make the reference measurements in proximity to a point at which electrical mains power enters the facility.

The different processing units may be collocated with at least one of the local sensing devices, or may be included within a central control unit, which is adapted to receive the local measurements from the local sensing devices that are deployed at different locations in the facility.

In an aspect of the invention, the processor is adapted to compare the local measurements to the computed reference values in order to differentiate between electrical faults—internal to the facility or external to it. The processor is further adapted to locate the fault within the system. Additionally or alternatively, the processing units are adapted to learn a normal behavior pattern of the voltage level and continuity measurements in accordance with each of the local sensing devices, and to detect the fault in response to a deviation of the local measurements from the normal behavior pattern. Typically, the processing units are adapted to learn the normal behavior pattern during a learning phase of the system, and to detect the fault in the electrical system in response to a failure occurring during the continuous monitoring phase. The studied normal behavior parameters are used to control a Voltage-Controlled-Oscillator (VCO) or a Numerically-Controlled-Oscillator (NCO)—by frequency, amplitude and phase so that momentary expected values of the mains supply may be obtained from the VCO or NCO.

There is also provided, in accordance with an embodiment of the present invention, a method for monitoring an electrical system of a facility, the method includes connecting each of one or more local sensing devices to the electrical system of the facility in proximity to a respective load that receives power from the electrical system; making local voltage and continuity measurements across each of the loads using the local voltage sensing devices; computation of reference values; providing reference measurements of the voltage supplied to the facility; communicating at least one of the local measurements and the computed or measured reference values over a communication medium to one or more processing units; and comparing the local measurements to the reference values, using the processing units, in order to detect faults in the electrical system.

Making the reference measurements may include connecting a reference voltage sensing device in proximity to a point at which electrical mains power enters the facility, or alternatively, it may include sensing a reference voltage on mains external to the facility.

Making the reference measurements may also include obtaining electrical-power continuity information from any other such continuity devices in the facility or from a continuity device external to the facility.

In embodiments of the invention, communicating the at least one of the local measurements and the reference measurements includes conveying messages by modulation of signals over power lines of the electrical system, over a wireless medium, over dedicated lines, over data-communication network, over infra-red or over acoustic medium.

According to another aspect of the invention, measured and/or computed values may be transmitted over the communication media using either direct analog modulation or by digitally modulated signals. Preferably, The modulation schemes used shall be simple enough to enable an easy demodulating process in the receiving. For example—frequency-modulation (FM) of a sine wave over the powerline may enable several measuring devices to send information containing the voltages measured by each sensing device. Modulation may be performed in accordance with the measured voltage and a unit code—so that the transmitting device may be identified by other devices. It should be noted that FM is preferable modulation over Amplitude-modulation (AM)—as the frequency in FM is not affected by line attenuation, whereas AM, being based on varying amplitude, is severely subject to line attenuation.

In the same manner—continuity information may be transmitted over the communication media. The transmission of digital modem-messages or directly-modulated analog signals need not be continuous. In order to enable other devices use the communication media—the transmission of message can be done on a periodic basis, or when the accumulated changes cross a pre-defined threshold.

BRIEF DESCRIPTION OF THE DRAWINGS

These and further features and advantages of the invention will become more clearly understood in the light of the ensuing description of a preferred embodiment thereof, given by way of example only, with reference to the accompanying drawings, wherein

FIG. 9 is a flow chart illustrating the manner of operation of the Control Unit, in accordance with a preferred embodiment of the present invention, with relevant to continuity measurements.

DETAILED DESCRIPTION OF THE PREFERRED EMBODIMENTS

The proposed system according to the present invention provides early, manual and/or automatic detection of electrical faults in wiring systems and/or in the loads connected to the system. The system can be implemented as a single apparatus, for performing local tests, or may be further implemented as a system and provide detection of electric faults on a plurality of wiring systems and connected loads. An early detection spares the need to immediately disconnect the system from the main power supply. The system is provided to monitor local voltage levels across electrical loads and continuity measurements since electrical-power was continually supplied to one or more points in the electrical system of a facility, such as a home, business, vehicle, aircraft or ship. By measuring and tracking changes in the local voltage and continuity measurements regarding the presence of electrical-power, the system is able to detect changes and events that may be indicative of faults in the wiring, in the electrical-current conducting equipment or in electrical equipment that is powered by the wiring.

Figure 1:
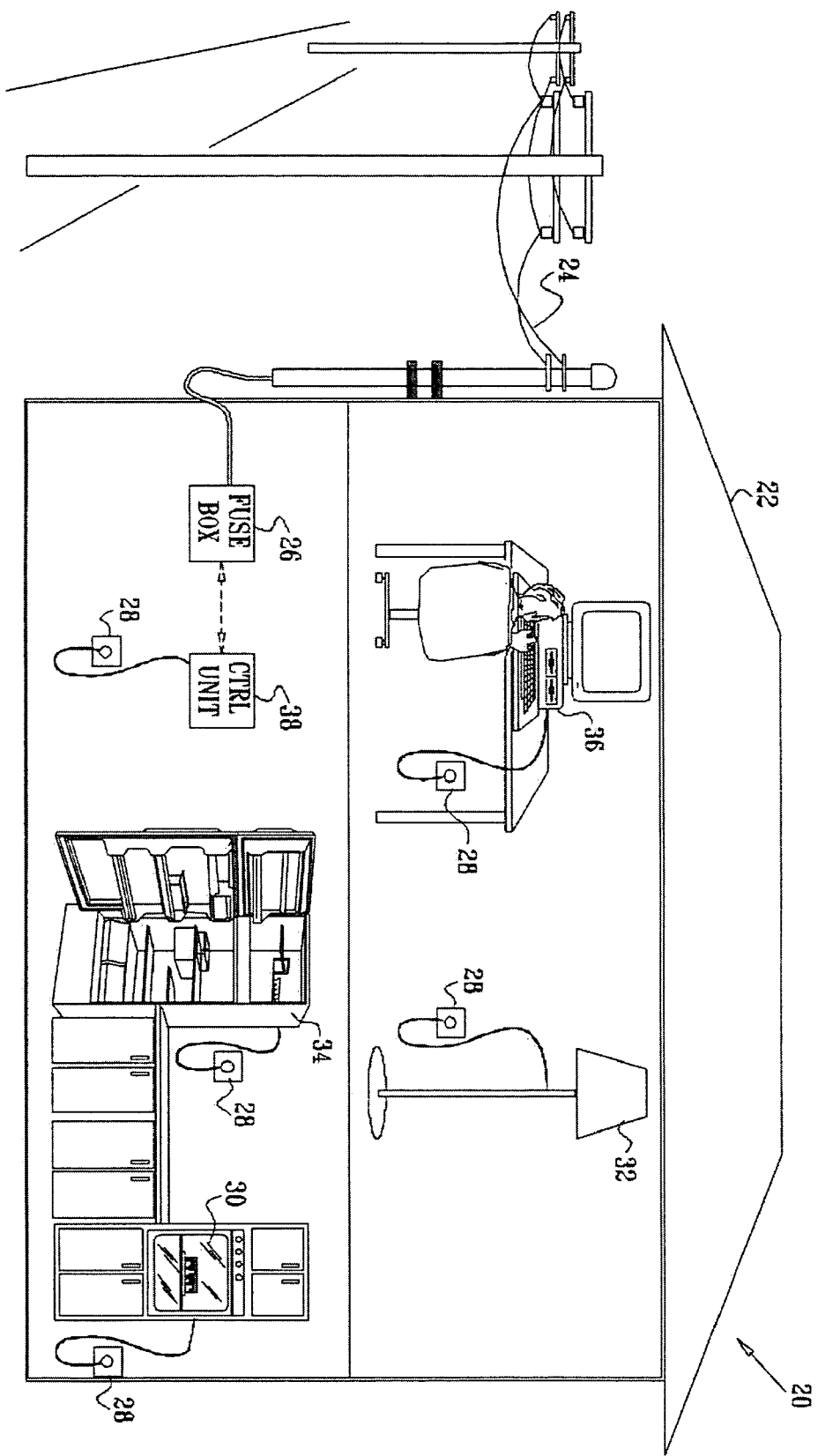
FIG. 1 illustrates the implementation of the proposed system in accordance with a preferred embodiment of the present invention, depicting the electrical networking in a typical house.

FIG. 1 illustrates the implementation of the proposed system in accordance with a preferred embodiment of the present invention, depicting the electrical networking in a typical house. Although the facility shown in this figure is a house, this should not limit the scope of the invention, since the present invention can be implemented in similar facilities such as businesses, public buildings, automobiles, airplanes, ships and trucks. A main power supply [24], such as external power lines, is provided to supply electric power to the house [20]. The electric power is supplied to a fuse box [26], which is located in close proximity to the house. The fuse box contains fuses, circuit breakers and voltage and continuity sensing devices. The electric power is then distributed via a wiring to different wall sockets [28] located inside the house. The wall sockets are connected to various types of electric equipment, whereas this electric equipment has different load characteristics as follows:

Heating and lighting appliances, such as an electric oven [30] and a lamp [32], have resistive load characteristics. Motorized appliances, such as a refrigerator [34], exhibit inductive load characteristics. Electronic devices, such as a computer [36], are typically powered via a built-in transformer, and thus behave as a different sort of inductive load. The proposed system includes local sensing devices [46] (see FIG. 2), which are applied to continuously monitor the Alternating Current (AC) voltage level near each wall socket, transmit modulated signals to a central Control Unit [38], and as a result provide information regarding the operation of the different appliances in the house. The sensing devices are typically constructed as plug adapters, which are plugged in between the power plugs of different pieces of electrical equipment and the sockets that feed these power plugs. These sensing devices may be further located in other parts of the wiring system (e.g. within wall sockets, switches and junction boxes) or directly integrated within the appliances themselves. The modulated signals are transmitted to the Control Unit over the electrical wiring itself using methods of power line communications known in the art. Alternatively, the local sensing device may communicate with the Control Unit by other means of communication known in the art, such as dedicated lines, data-communication network, wireless communication over Radio Frequency (RF), Infra-Red (IR) or acoustic links. The Control Unit receives information about voltage variations of the sensing device's AC voltage level and then analyzes and compares these readings to a reference level, said reference level corresponding to the voltage initially provided by the main power supply [24]. The reference level may be just a voltage level—in case of a direct-current (DC) electrical-power, or a combination of amplitude, phase and frequency indications—in case of alternating-current (AC) electrical-power system. When the Control Unit detects an abnormal variation in the voltage readings of a sensing device in relative to the reference level, it informs the system by sending an alarm signal and may cut off the voltage supplied to appropriate wiring by triggering a circuit breaker in the fuse box or within the appliance itself. Furthermore, the Control Unit is configured in accordance with the present invention to detect electrical faults within the system independent of said reference level. Said configuration is essential for detection of electrical faults when no initial voltage samplings are available.

Figure 2:
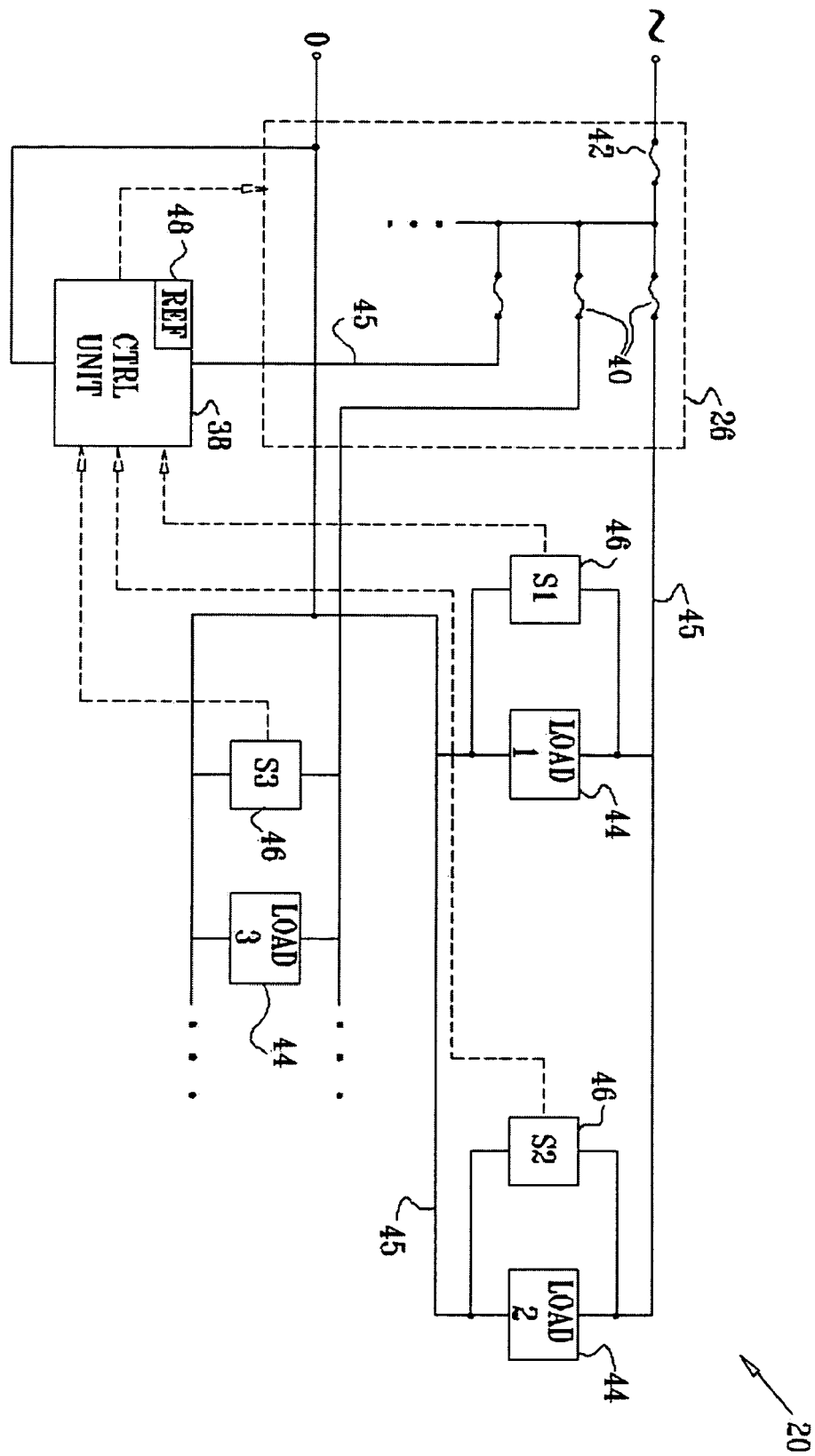
FIG. 2 is an illustration of the proposed system in accordance with the present invention.

FIG. 2 is a block diagram of the proposed system in accordance with the present invention. A main wiring line [45] supplies alternating current (~) and provides Neutral connection (0). AC electrical power is distributed through the fuse box [26] and to the different loads [44], each loads created by a different appliance (e.g. electric oven, refrigerator, lamp, computer, etc.). The fuse box is an electric circuit including a main circuit breaker [42] and comprised of a plurality of parallel branches. Each branch includes a circuit breaker [40], operating in series with the main circuit breaker. The proposed system is based on a single AC phase. However, multiple AC phases may be further provided.

Each sensing device, which is located in proximity to the respective load [46], is parallel-connected to each load and is programmed to transmit modulated signals of relevant AC voltage level to the central Control Unit [38]. The transmission may be either continuous or periodic or change-driven.

The wiring is designed to have low electrical resistance and therefore the impedance of each load is much higher than the wiring. Hence, these sensing devices are enabled to measure local load voltage that is only slightly lower than the reference level measured by a reference sensing device [48].

A number of different causes may lead to a substantial voltage drop measured by any one of the sensing devices. These causes include a short circuit or other malfunction in a load which reduces the effective impedance of the load, a loose connection or other fault in the wiring causes an increase in the impedance of said wiring, and an independent voltage drop in the main supply. An unexpected increase in the local load voltage, occurring rapidly or gradually over time, may also indicate an electrical fault.

The Control Unit identifies the type of each load [44]—may it be resistive, inductive or capacitive, preferably distinguishing, as well, between inductive motor coils and transformer windings. This unit additionally learns the normal operating pattern of each load, such as the characteristic on/off cycling of heaters, ovens and other appliances, and spikes that commonly occur when inductive loads are switched on.

As noted above, the Control Unit tracks and analyzes the voltage measurements made by each sensing device, including instantaneous and past measurements, and then proceeds to compare these measurements to a baseline voltage level measured by the reference sensing device.

In addition, independent of measuring voltage, the Control Unit is configured to analyze continuity measurements made by each sensing device, said measurements define (in terms of time units or AC cycles) the elapsed time since power was continually applied to each sensing device and appropriate load, and then detects the location of a power cut-off within the system. Continuously-increasing measurements of a specific sensing device indicate that power is continually supplied to said device. On the opposite, repetitively-restarting measurements indicate frequent intermissions in the electrical power which is supplied to said device. Based on these measurements, the Control Units detects unintentional disconnected power wiring in the system and an absence of power supply to the load and to the sensing devices themselves. For example, the Control Unit may detect that an appliance monitored by a particular sensing device does not operate continuously for more than a certain period of time. This input information enables the Control Unit to detect hazard conditions that are not immediately reflected by abnormal voltage changes, such as an oven that has been left on, presumably unattended, for several hours. For this purpose, control unit [38] may comprise a communication interface to a personal computer or other computing device. Such an interface also enables data that has been recorded by the control unit or sensing devices [46] to be uploaded to the computer for further processing, analysis and display. Hence, the Control Unit is able not only to detect anomalies that may be indicative of faults in the loads or wiring, but also to determine the type and specific location of the electrical fault which is most likely.

According to another aspect of the invention the control unit may use a counter powered by a battery or by a capacitor functioned to measure the length of time when no power is supplied to the whole facility. By this, the control unit will be able to distinguish between a power cut-off due to loose-connection in a facility and a power cut-off due to problems in the mains supply from the electric utility.

Figure 3:
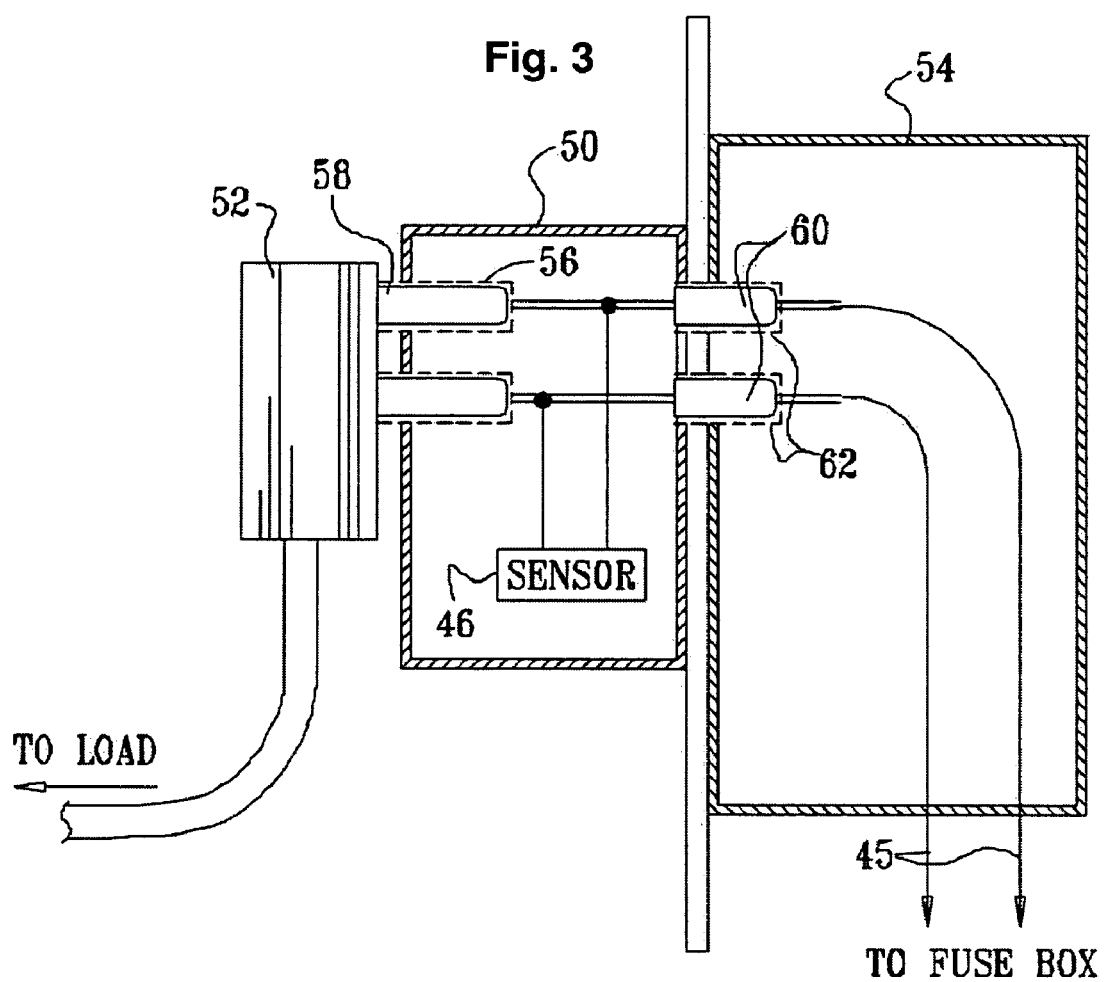
FIG. 3 is an illustration of the implementation of a local sensing device, in accordance with a first embodiment of the present invention.

Reference is now made to FIG. 3, illustrating an implementation of a local sensing device, in accordance with a first embodiment of the present invention. An adapter [50], located between an AC power plug [52] and a wall socket [54], is comprised of a first set of receptacles [56] for inserting its prongs [58] to the power plug. These receptacles are wired via the adapter to a second set of receptacles [62] for inserting its prongs [60] to the wall socket. The sensing device [46], situated within the housing of the adapter, is coupled in parallel to the first set of receptacles [56] and to the prongs [60] of the adapter.

The configuration of the adapter according to the first embodiment of the present invention enables to install the proposed system within a facility simply by attaching or plugging in adapters of this type at desired sockets in the facility.

According to another aspect of the invention, the sensing device may sense the voltages at two points in parallel—one in close proximity to the receptacles [56] and the other in close proximity to the prongs [60]. In particular, the conductor between receptacles [56] and prongs [60] has a small resistance value. Therefore, when the load consumes power—the electrical current to the load through that conductor causes a small voltage drop across that conductor. By measuring both voltages simultaneously—the sensing device can detect the presence of electrical current through it, and determine the direction of the current. The voltages measured at receptacles [56] and prongs [60] would have similar values only if there is no current passing through the adapter. In case of no current passing through the adapter— the voltage measured at the adapter is expected to have a closer value to the voltage level that enters the facility, or at least the voltage level at the entry to the mains branch to which the sensing unit is connected. It should be noted that the resistance of the conductor between receptacles [56] and prongs [60] is not required to be precise. The sensing unit will be able to differentiate between the loaded or not-loaded states of the adapter—by differentiating between the two different voltage-drop levels across that conductor.

Figure 4:
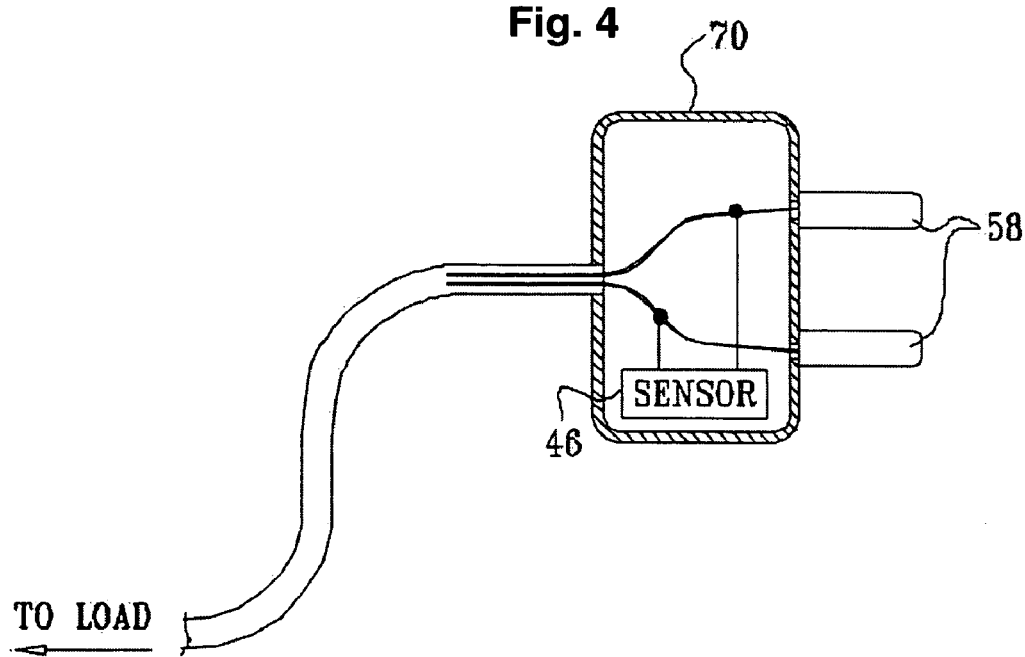
FIG. 4 is an illustration of the implementation of a local sensing device, in accordance with a second embodiment of the present invention.

FIG. 4 illustrates an implementation of a local sensing device, in accordance with a second embodiment of the present invention. The device, according to the second embodiment, is situated within the AC power plug [70].

Figure 5:
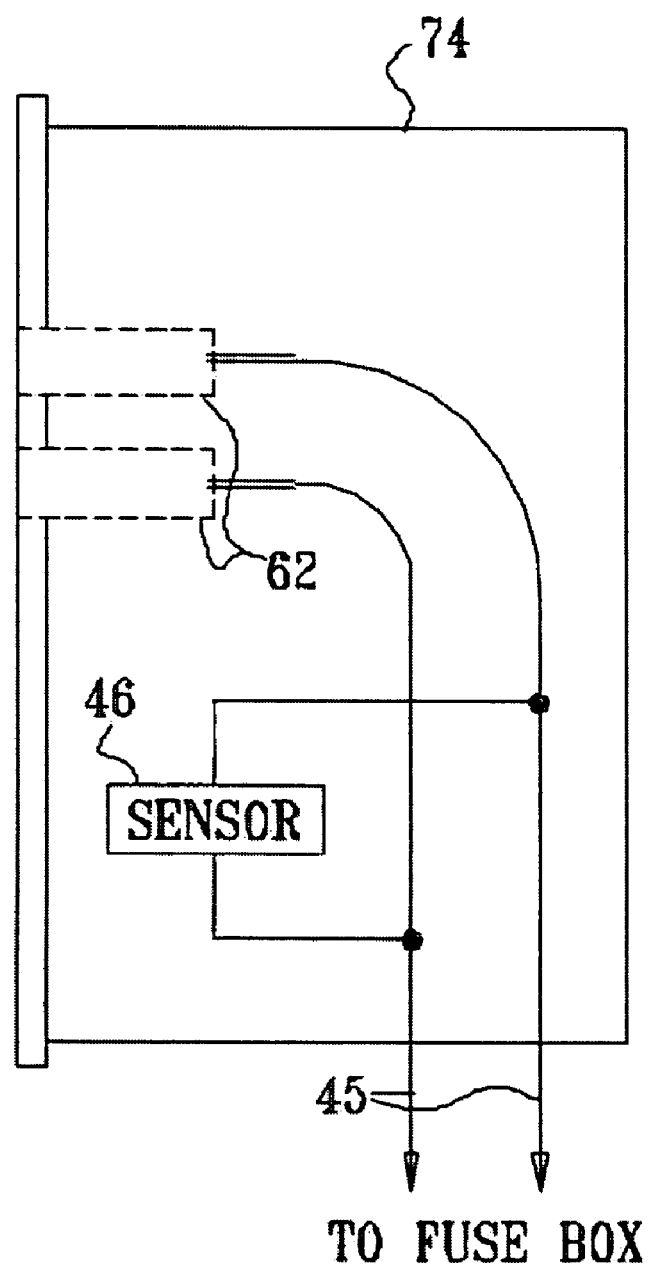
FIG. 5 is an illustration of the implementation of a local sensing device, in accordance with a third embodiment of the present invention.

FIG. 5 illustrates an implementation of a local sensing device, in accordance with a third embodiment of the present invention. The sensing device, according to the third embodiment, is situated within the wall socket [74].

Figure 6:
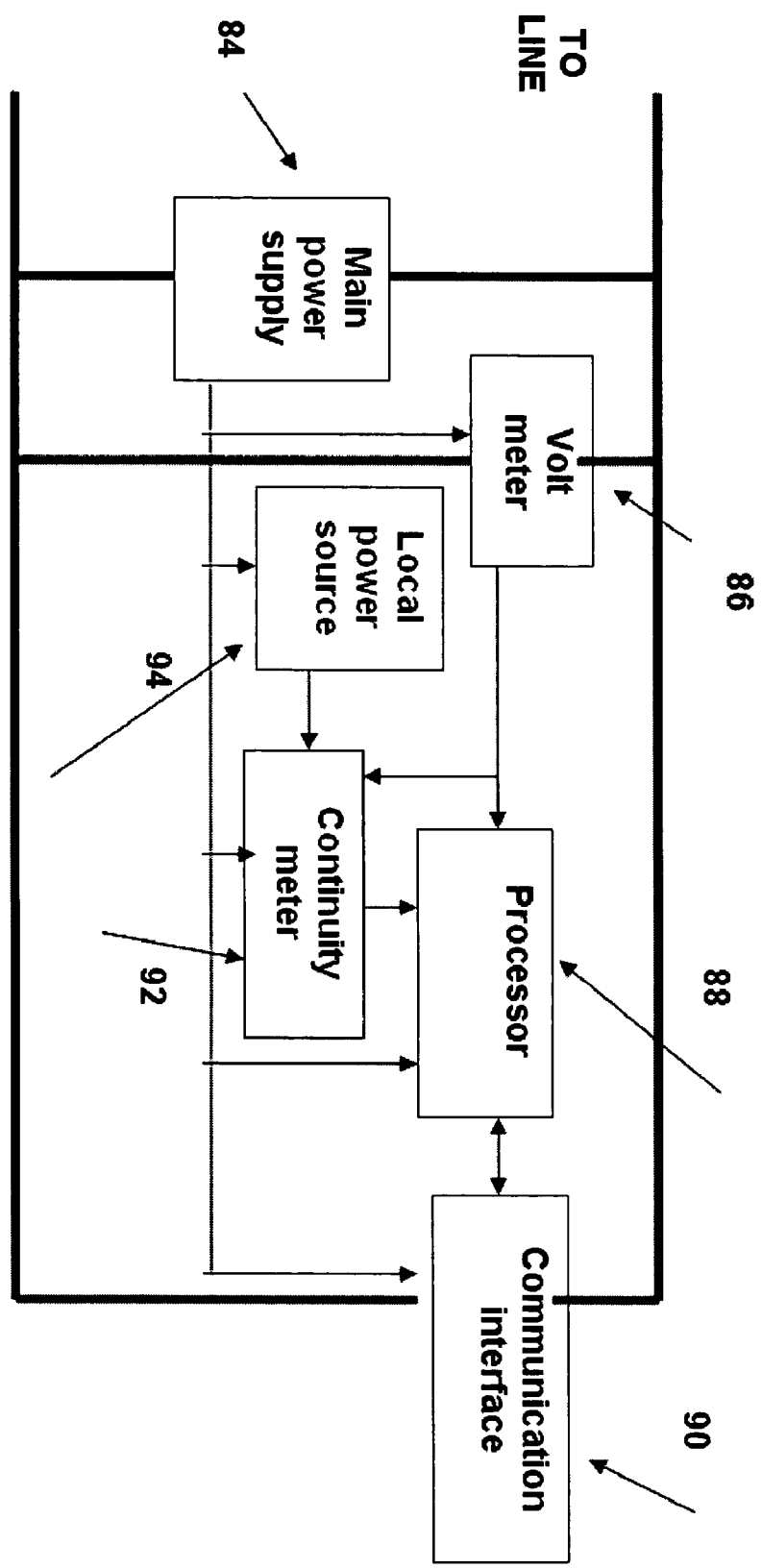
FIG. 6 is a block diagram of the local sensing device in accordance with the present invention.

FIG. 6 is a block diagram of the local sensing device, in accordance with the present invention. AC wiring lines [80] and [82] are connected to the main wiring line [45]. A power supply [84] receives AC power from these wiring lines and generates DC voltages that power the other parts in the circuit. The power supply further includes a local power source [94], which may be a capacitor or any type of battery (optionally rechargeable battery), provided for independently supplying electric energy to only specific sensing devices in the circuit when no electric power is supplied from the power lines.

The electric circuit comprising the sensing device further includes an Analog-to-Digital converter [86], for performing measurements of the voltage level between lines [80] and [82] and transmit a digital signal of said voltage level to a processor unit [88]. According to another aspect of the invention the sensor devices shall be in the form of two analog-to-digital converters that may simultaneously measure the voltage levels of the phase (=hot) line and the neutral line—compared to the ground line. These measurements are received without the need to apply similar electrical operations required to measure and determine the voltage level and phase at any particular moment, such as frequency-domain filtering or amplitude scaling. The processing units are further provided to store data and sensed values and to perform calculations over time. These calculations include integration, averaging, standard deviation, Root-Mean-Square (RMS) calculations and/or any other statistical calculations and data-processing required to identify electrical fault.

According to another aspect of the invention the processing unit may include numerically-controlled oscillator or an analog oscillator functioned to continuously track the voltage level as it is expected to be at the point where the mains lines enter the facility. The difference between the momentary value of that oscillator and the momentary measured voltage across the load is the momentary voltage drop on the line from the mains entry-point to the sensing unit. Integration of the absolute value s of these differences will yield the over-time voltage drop on the line from the mains entry-point to the sensing unit.

A Continuity meter device [92] is provided to measure the time or AC cycles that elapsed since power was continually supplied to the sensing device, whereas a discontinuity of electrical power at lines [45] restarts the counting procedure of said continuity metering device. The processor compares these time measurements with measurements obtained from other continuity devices in the proposed system and transmit them (along with a unique identification code) via a communication interface [90] to the Control Unit [38] (see FIG. 1). Said procedure enables to detect abnormal power behavior of a specific sensing device. A series of restarts indicate a disconnecting wiring connection, while continuous readouts indicate no disconnection. Hence, applying such time measurements enables to detect the presence of an electrical fault in relation with a specific sensing device.

In addition, this continuity device may be comprised of several sub-counters of different powering and resetting schemes. For example, one counter may be adopted to restart its counting in case a discontinuity of power supply has occurred in wires [80] and [82], while another counter is provided to count the time electric power is supplied to the sensing device regardless of the presence of electric power in the wires. Additionally, the continuity device may use a counter—powered by a battery or by capacitor—to count operation time without being dependant on the power from the mains supply. Thus the processor can distinguish between continuity-restarting that happened due to momentary, faulty disconnection in the powerline—and a valid counting restart after disconnection of the sensing unit, or a general power-supply problem due to circumstances that are outside the facility.

The present invention may further comprise an analog modulation circuit known in the art, such as a Voltage-Controlled-Oscillator (VCO). By applying the VCO, which is a voltage-to-frequency converter, the Control Unit [38] senses the analog modulation on the main wiring line [45] (see FIG. 1) in order to determine if electric power is supplied to the sensing device.

The implementation of the local sensing device [46] includes a plurality of functional blocks. However, this device may be implemented in a single semiconductor chip or in a set of two or three chips as follows:

According to one implementation, the processor comprises a microcontroller with limited firmware instructions, thus invoking the microcontroller to periodically transmit voltage and time measurements at fixed intervals for analysis by the Control Unit.

According to yet another implementation, the processor comprises a microprocessor, which analyzes the voltage and time measurements received from the Analog-to-Digital converter [86] and Continuity-meter [92]. This microprocessor is provided to detect abnormal fluctuations in the voltage levels, and/or counting indications and/or computed voltage drop—and transmit a signal to the Control Unit indicating a possible electrical fault.

Applying a two-way communication interface [90], through which a particular sensing device communicates with other such devices, enables each processor to locally perform and analyze all the required measurements. Furthermore, the sensing device may itself comprise a simple user interface and set of alarms. Hence, such a sensing device performs all the voltage and time measurements required for detecting an electrical fault, whereas the need to implement a separate Control Unit is obviated entirely. This implementation is equivalent to disturbing the Control Unit's functionality at different locations within the facility and is useful particularly when the reference measurements are made at some external point, closer to the supplier of the electrical energy, for use by a number of facilities.

The processing unit may be implemented in the form of a dedicated processor chip, a dedicated processor chip with additional devices, part of an ASIC or as a part of an FPGA as known in the art.

Figure 7:
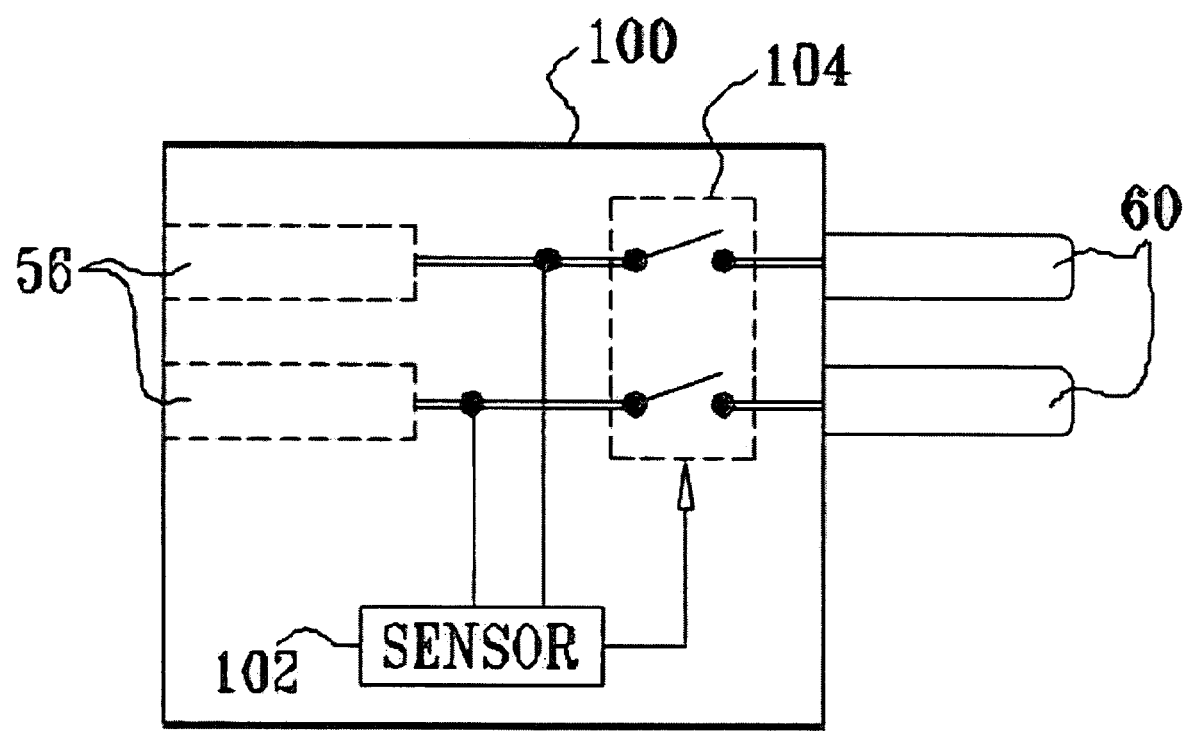
FIG. 7 is an illustration of the implementation of a circuit breaker, in accordance with the present invention.

FIG. 7 illustrates an implementation of a circuit breaker, in accordance with the present invention. The proposed adapter [100] is comprised of a first set of receptacles [56] and prongs [60], a sensing device [102] and an internal circuit breaker [104]. The electrical faults may be either detected by the microprocessor within the sensing device, as described above or by the Control Unit [38], signaling the sensing device via a communication interface to trip the circuit breaker accordingly.

The circuit breaker is a protection device, including both one-time fuses and/or switches. These are provided to reset automatically or manually after they are tripped. Said protection device is designed to disconnect at least one conductor in the receptacles in order to de-energize the electrical system connected to the wire lines of the second set of receptacles [60]. In addition, the device may be applied to generate an intentional connection between the alternating wiring (~) and ground connection of a facility. This connection enables a central Ground-Fault-Circuit-Interrupter (GFCI) to trip and disconnect numerous appliances from the electrical power.

Figure 8:
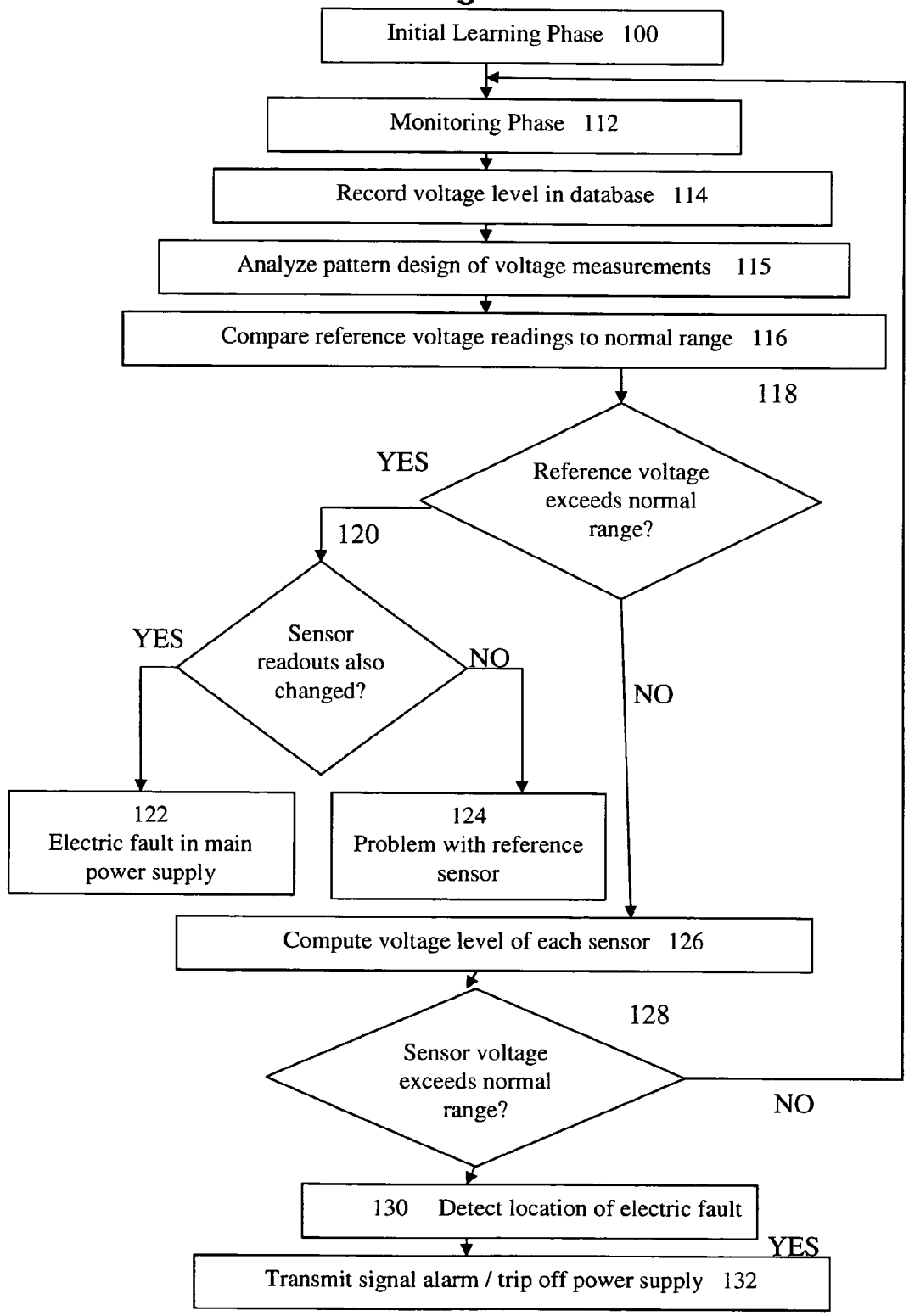
FIG. 8 is a flow chart illustrating the manner of operation of the Control Unit, in accordance with a preferred embodiment of the present invention, with relevant to the voltage level.

FIGS. 8 and 9 are flow charts that schematically illustrate the operation of control unit [38], in accordance with an embodiment of the present invention. As noted above, some or all of these functions of the Control Unit may alternatively be performed by processors [88] in local sensing devices [46] or [102]. Therefore, although the functions shown in FIGS. 8 and 9 are described herein below as being carried out by Control Unit [38], it will be understood that these functions may be distributed in any suitable fashion between processors in the Control Unit and in the local sensing devices.

Reference is now made to FIG. 8. This figure describes in details the typical operation flow of detecting voltage and/or voltage-drop faulty conditions. In an initial learning phase [110], the Control Unit receives and monitors voltage/voltage-drop data from each of the local sensing devices in order to establish a pattern of normal behavior for each local sensing device. This phase may be invoked by a user, for example, via a user interface of the Control Unit, or it may be initiated automatically when a sensing device is plugged into the power network, or when the control unit itself is plugged into the power network. The pattern behavior recorded at this stage is meant to be indicative of the behavior of wiring lines [45] and of loads [44] in the absence of any malfunction, although irregularities involving abnormal voltage behavior may be further detected even in this initial phase. During phase [110] the Control Unit [38] records normal voltage drop behavior at each local sensing device [46] with relevance to reference voltage measurements performed either locally or by a main reference sensor [48] near the point at which electrical power enters the facility.

During the receiving phase [113], after the completion of phase [110], the Control Unit [38] receives voltage/voltage-drop data from sensing devices [46], whereas these voltage/voltage-drop data define the relevant values read by local and remote sensing devices [46] in the facility.

At step [114] these voltage/voltage-drop data are recorded in a database for subsequent review and possibly for the purpose of modifying the learned behavior recorded at step [110].

Step [115] analyzes the pattern of the voltage/voltage-drop data made by each sensing device [46] over time and computes the voltage level of each sensor.

Step [116] computes reference voltage for the facility. This reference value may be directly generated by a main reference sensor [48], provided from an external source or concluded from measurements performed on each sensing device individually.

At step [118] the Control Unit [38] compares the actual voltage/voltage-drop data reference voltage measurements readings to predefined upper and lower voltage/voltage-drop limits. The voltage limits define the normal range of lines voltage that is expected to be supplied to a specific facility and the allowed voltage drop percentage. If the measured voltage or the voltage drop are out of the normal/allowed range, the Control Unit proceeds to step [120].

Step [120] checks the voltage readings of sensing devices [46]. This step is applied only in case a reference sensing device [48] is provided (see FIG. 2). If these readings have similarly increased or decreased in a manner that reflects the increase or decrease in the reference voltage (step [122]), the Control Unit concludes that there is a problem in the voltage input from the mains power supply to the facility. In this case, the Control Unit may issue an audible or visible alarm. It may further instruct fuse box [26] or sensing devices [46] within the facility to shut off the electrical power in order to prevent damage to existing appliances. Alternatively at step [124], if the control unit finds at step [120] that the readings of sensing devices [46] are behaving normally and have not changed along with the reference voltage reading, the Control Unit concludes that there is a fault associated with the reference sensor [48] itself. For example, the wiring to the reference sensor may be disconnected or otherwise faulty. The Control Unit may, in this case, set an alarm to indicate that a fault condition is suspected.

It should be noted that steps [120] through [124] are applied only in case a main reference sensing device is provided. However, if this is not the case (i.e. reference voltage readings are concluded from measurements performed on each sensing device individually), then steps [120] through [124] are skipped.

In step [118], the Control Unit [38] checks whether the reference voltage (found at step [115]) is within the proper range, Control Unit [38] proceeds to step [128]. In step [128] the Control Unit compares the value of the voltage measurement made by each sensing device to predefined upper and lower voltage limits, and may check whether the computed voltage-drop percentage is within the allowed range. Note that this step is performed for each of sensing devices [46] in turn or in parallel. If the values measured and computed at each sensing device are in the acceptable range, the Control Unit returns to step [113] and cycles indefinitely through the process that has been described above.

Otherwise, (i.e. if the value measured by any of the sensing devices is out of the normal range indicated by these limits, or the computed values are out of a predefined allowed range), the Control Unit concludes that a fault has occurred in one of loads [44] or in wiring [45]. Based on the identity of the sensing device reporting the anomalous voltage/voltage-drop readings, the Control Unit identifies the location of the fault (step [130]). The control unit may also analyze the pattern of the readings reported by the sensing devices in order to assess the type of fault that has occurred, for example, to determine whether the fault is in wiring [45] or in one of loads [44]. In step [132] the Control Unit issues an alarm, indicating the fault location. The Control Unit may also instruct the appropriate circuit breaker [40] (in fuse box [26]) or [104] (as in sensing device [100]) to shut off the power supplied to the faulty circuit.

Reference is now made to FIG. 9. This figure describes in details a typical flow of detecting continuity problems. In an initial learning phase [140], the Control Unit receives and monitors continuity behavior from each of the local sensing devices in order to establish a pattern of normal behavior for each local sensing device. During this phase the Control Unit [38] records normal continuity behavior of each local sensing device [46] (in terms of time units or AC cycles).

During the data-collection phase [142], the Control Unit receives continuity time measurements from local and remote sensing devices [46], whereas these measurements define the elapsed time since electrical power was continually applied to each sensing device and appropriate load within the facility.

At step [144] these continuity measurements are recorded in a database for subsequent review and possibly for the purpose of modifying the learned continuity behavior recorded at step [140].

Step [146] analyzes these continuity values over time.

In step [148] the Control Unit [38] compares continuity measurement readings of remote sensing devices to predefined upper and lower continuity limits. The continuity limits define the normal range of elapsed time that is expected since electrical power was continually applied to each sensing device. If the continuity values of the remote sensing devices are within the normal range, the Control Unit proceeds to step [154].

In step [154] the Control Unit [38] compares continuity measurement readings of local sensing device to predefined upper and lower continuity limits. If the continuity values of said sensing devices are within the normal range, the Control Unit returns to step [142] and cycles indefinitely through the process that has been described above. Otherwise, the Control Unit issues an alarm indicating the location of the electrical fault (step [156]). The Control Unit may also instruct the appropriate circuit breaker [40] (in fuse box [26]) or [104] (as in sensing device [100]) to shut off the power supplied to the faulty circuit.

If the continuity values of the remote sensing devices compared in step [148] are out of the normal range, the Control Unit proceeds to step [150].

In step [150] the Control Unit concludes that a fault has occurred in one of loads [44] or in wiring [45]. Based on the identity of the sensing device reporting the continuity readings, the Control Unit identifies the location of the fault (step [150]).

In step [152] the Control Unit transmits an electric signal, notifying other sensing devices in the facility the existence of such an electrical fault.

Although the embodiments described above refer to monitoring of AC lines voltage, and specifically to monitoring functions carried out in a typical house, the methods and devices described herein are similarly applicable, *mutatis mutandis*, to detection of faults in the electric systems of other facilities. As noted above, the term "facility" as used in the preferred embodiments and claims according to the present invention should be understood broadly to include not only buildings, but also outdoor facilities and vehicles, such as office buildings, factories, airplanes, ships and trucks. The principles of the present invention may likewise be applied to monitoring of DC voltage levels supplied in such facilities.

In addition, the sensing device may be further implemented within the electric appliance itself or connected to other switches and junction boxes, whereas the connection to the power network may either be a fixed-connection or applied via a detachable power plug.

It should be noted that the implementation of a system that displays the values measured and computed and allows a person to analyze them is also applicable. Such a system can be configured without any communication media between parts of the system and can therefore be very cheap and easy to implement and install. Such a system is useful as the computation of the voltage drop percentage requires many measurements and calculations to be performed in very short periods of time. Such a system can perform voltage-drop measurements and calculations during the regular mode of operation of the factory. This, as opposed to existing voltage-drop measurement equipment that requires specific conditions to be applied in order to perform voltage-drop measurements.

While the above description contains many specifities, these should not be construed as limitations on the scope of the invention, but rather as exemplifications of the preferred embodiments. Those skilled in the art will envision other possible variations that are within its scope. Accordingly, the scope of the invention should be determined not by the embodiment illustrated, but by the appended claims and their legal equivalents.

What is claimed is:

1. A system for detecting voltage drops along at least one electrical branch of an electrical network of a facility connected to a main power supply, said system comprising:
    at least one sensing device connected to an electrical branch of said electrical network in proximity to a respective load wherein said load receives power from said electrical network;
    wherein said sensing device comprises an oscillator for tracking the electrical signal in proximity to a point at which said main power supply enters the facility wherein said tracked signal represents the signal of an unloaded electrical branch and wherein said oscillator is at least one of the following: voltage controlled oscillator (VCO), numerically controlled oscillator (NCO);
    and wherein said sensing device further senses the momentary voltage level in proximity to a respective load;
    and wherein said voltage drop is the difference between the momentary voltage level indicated by the momentary value of the VCO/NCO and the momentary voltage level sensed in proximity to a respective load.

2. The system according to claim 1, wherein said VCO/NCO tracks at least one of the following parameters of the signal at the entry point of said electrical network: amplitude, phase, frequency.

3. The system according to claim 2, wherein said facility is at least one of the following: residential unit, office, business, vehicle, aircraft, ship.

4. The system according to claim 2, further comprising at least one processing unit coupled to at least one said sensing device, wherein said processing unit provides an analysis of the voltage drops in the said electrical network.

5. The system according to claim 4 wherein said analysis of the voltage drops in the said electrical network comprises at least one of the following: detecting the presence of electrical faults of excessive voltage drop over the electrical network defined from the entry point of the main power supply and the sensing device, distinguishing between voltage faults of voltage drop at the sensing devices due to excessive voltage drop over the electrical branch and voltage drop at the sensing devices due to fluctuations in the main power supply voltage, identifying the location of electrical faults—by identifying the sensing device related to the excessive voltage drop.

6. The system according to claim 4, wherein said sensing device is connected to an electrical socket from which a load receives the power.

7. The system according to claim 6, wherein the said sensing device comprises a communication interface, for communicating with said processing unit.

8. The system according to claim 7, wherein the communication interface conveys messages between the said sensing device and said processing unit via at least one of the following means: wired communication, wireless communication.

9. The system according to claim 8, wherein the said sensing device further comprises a continuity sensing device for detecting discontinuities of electrical-power along said electrical branch.

10. The system according to claim 9, wherein the continuity sensing device counts the number of alternating-current (AC) cycles that elapsed since electrical power was continually applied to the said sensing device.

11. The system according to claim 9, wherein the continuity sensor counts the time units that elapsed since electrical power was continually applied to the said sensing device.

12. The system according to claim 4, wherein the said sensing device comprises a plug adapter comprising: receptacles which receive a power plug of the respective load; prongs for insertion into the electrical socket; and a voltage sensor that measure the voltage between the receptacles and the prongs.

13. The system according to claim 2, wherein the said sensing device further comprises a circuit breaker, enabling the sensing device to cut off the power to the load whenever a voltage drop beyond a predefined threshold is detected.

14. A method for detecting excessive voltage drops along at least one electrical branch of an electrical network of a facility having a main power supply, said method comprising the steps of:
    tracking the electrical signal in proximity to a point at which said main power supply enters the facility representing the signal when the branch is unloaded;
    sensing the momentary voltage level in at least one point along said electrical branch in proximity to a respective load;
    computing the voltage drop over at least one electrical branch, wherein the computed voltage drop is the difference between the tracked signal in proximity to a point at which said main power supply enters the facility and the momentary voltage level sensed in proximity to a respective load;
    learning a normal behavior pattern of at least one sensing device, wherein detecting voltage drops is performed in view of deviation from the normal behavior and in view of predefined limits;
    obtaining continuity-values from at least one continuity sensor connected to at least one electrical branch;
    comparing the obtained continuity values against values obtained from reference historical measurements.

* * * * *